(12) United States Patent
Singh et al.

(10) Patent No.: US 7,855,108 B2
(45) Date of Patent: Dec. 21, 2010

(54) SEMICONDUCTOR HETEROJUNCTION DEVICES BASED ON SIC

(75) Inventors: Narsingh B. Singh, Ellicott City, MD (US); Brian P. Wagner, Baltimore, MD (US); David J. Knuteson, Linthicum, MD (US); Michael E. Aumer, Laurel, MD (US); Andre Berghmans, Owing Mills, MD (US); Darren Thomson, Ellicott City, MD (US); David Kahler, Arbutus, MD (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 0 days.

(21) Appl. No.: 12/713,753

(22) Filed: Feb. 26, 2010

(65) Prior Publication Data

US 2010/0192840 A1    Aug. 5, 2010

Related U.S. Application Data

(62) Division of application No. 11/474,398, filed on Jun. 26, 2006, now Pat. No. 7,683,400.

(51) Int. Cl.
*H01L 21/338* (2006.01)
(52) U.S. Cl. .......... 438/172; 438/167; 438/191; 438/604; 438/606; 257/E21.403; 257/E21.407
(58) Field of Classification Search .......... 438/167, 438/172, 191, 604, 606; 257/E21.403, E21.407
See application file for complete search history.

(56) References Cited

U.S. PATENT DOCUMENTS

2004/0256613 A1* 12/2004 Oda et al. .......... 257/19

* cited by examiner

*Primary Examiner*—Wael M Fahmy
*Assistant Examiner*—Minchul Yang
(74) *Attorney, Agent, or Firm*—Andrews Kurth LLP

(57) ABSTRACT

A $Si_{(1-x)}M_xC$ material for heterostructures on SiC can be grown by CVD, PVD and MOCVD. SiC doped with a metal such as Al modifies the bandgap and hence the heterostructure. Growth of SiC $Si_{(1-x)}M_xC$ heterojunctions using SiC and metal sources permits the fabrication of improved HFMTs (high frequency mobility transistors), HBTs (heterojunction bipolar transistors), and HEMTs (high electron mobility transistors).

8 Claims, 8 Drawing Sheets

(a)        (b)

(c)        (d)

SEMICONDUCTOR HETEROJUNCTION DEVICES BASED ON SIC

BACKGROUND OF THE INVENTION

1. Field of the Invention

A semiconductor device has a doped silicon carbide heterojunction.

2. Description of the Related Art

Gallium nitride (GaN) is a typical wide-bandgap semiconductor material that has potential applications in high-speed, high power transistor devices. One of the main drawbacks to the production of these devices is the limited availability of suitable substrates for epitaxial growth. A high-quality bulk single crystal substrate such as silicon carbide (SiC), having low cost and having a large area, is desirable for the growth of GaN and other types of epitaxial layers for device fabrication. In one example of a related art technology, the GaN epitaxial layer is homoepitaxially grown on a single crystal GaN substrate. However, the cost and availability of these wafers are prohibitive.

Conventional heterostructures have already attained improved performance for high frequency group III-V semiconductor devices such as GaN devices. Initially, gallium arsenide (GaAs) metal-semiconductor field effect transistors (MESFETs) were the dominant devices for high frequency applications. Subsequently, several different heterostructures were developed in this material system, including AlGaAs/GaAs, ($\Delta E_g$ ~0.4 eV) and InAlAs/InGaAs ($\Delta E_g$ ~0.8 eV). High electron mobility transistors (HEMTs) utilizing these heterostructures can outperform their MESFET counterparts. For example, the optimized MESFETs show a maximum operating frequency ($f_{max}$) of 160 GHz, while GaAs pseudomorphic high electron mobility transistors (PHEMTs) have attained maximum frequency (fmax) values of 290 GHz, and InP PHEMTs have attained frequencies of 600 GHz.

Currently, GaN films are produced by hetereoepitaxial growth on either single crystal SiC or sapphire. Due to the lattice mismatch between GaN (4.8 Å) and sapphire (4.763 Å) or 4H-silicon carbide (3.0730 Å), a significant number of threading dislocations are formed during the growth process.

In the search to achieve large diameter, low defect, high quality SiC structures at affordable prices, SiC has become an important wide bandgap group III-V semiconductor because of its excellent properties for high power microwave devices. SiC thus competes with GaAs and Si in terms of gain, power output and efficiency at X-band, and promises even better performance at higher frequencies (Ka and Ku-bands). A particular goal for this technology is efficient broadband power RF transmitters that have high efficiency and high linearity, as well as rugged and low noise receivers for transmit/receive (T/R) modules for microwave applications.

As the technology advances, silicon carbide has become a good candidate. However, no heterostructure device has been achieved due to the unavailability of suitable SiC heterostructure material.

There is thus a need for practical metal-doped SiC materials that fulfill the requirements for wide bandgap semiconductor devices.

SUMMARY OF THE INVENTION

Accordingly, one aspect of the present invention is directed at producing a substrate that substantially obviates one or more problems due to limitations and disadvantages of the related art.

An aspect of the invention is to provide an Al doped SiC substrate grown using a physical vapor transport (PVT) method.

One aspect of the technology pertains to a semiconductor device that includes SiC layer over which is grown a metal-doped epitaxial layer.

Another aspect of the invention pertains to a method for forming a semiconductor device on a SiC substrate by growing an epitaxial film of $Si_{(1-x)}M_xC$ over the substrate, wherein M is Al, Ge or In and x is 0 to 1.

It is to be understood that both the foregoing general description and the following detailed description of the invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION

Reference will now be made in detail to the preferred embodiments of the invention, examples of which are illustrated in the accompanying drawings.

Utilizing Al as a dopant significantly affects the mobility and other properties of SiC materials and heterostructures that can be formed from SiC. This ability to form SiC/AlSiC permits the manufacture of higher performance SiC devices.

By adjusting the energy band gap by doping, for example with Al, devices such as high electron mobility transistors (HEMTs) and heterojunction bipolar transistors (HBTs) can be formed. In group III-V material systems, these materials provide performance far superior to MSFETs and bipolar junction transistors (BJTs), and have been important in increasing the high frequency performance of power devices. The invention provides a route to form similar devices utilizing SiC systems. Improvements can be attained in SiC MESFETs through the introduction of an $SiC/Si_{(1-x)}M_xC$ heterostructure, where M is Al, Ge or In. The invention provides energy band offsets with the possibility of attaining wider offsets. These values are similar or superior to those found in conventional art III-V materials.

Figure 1:
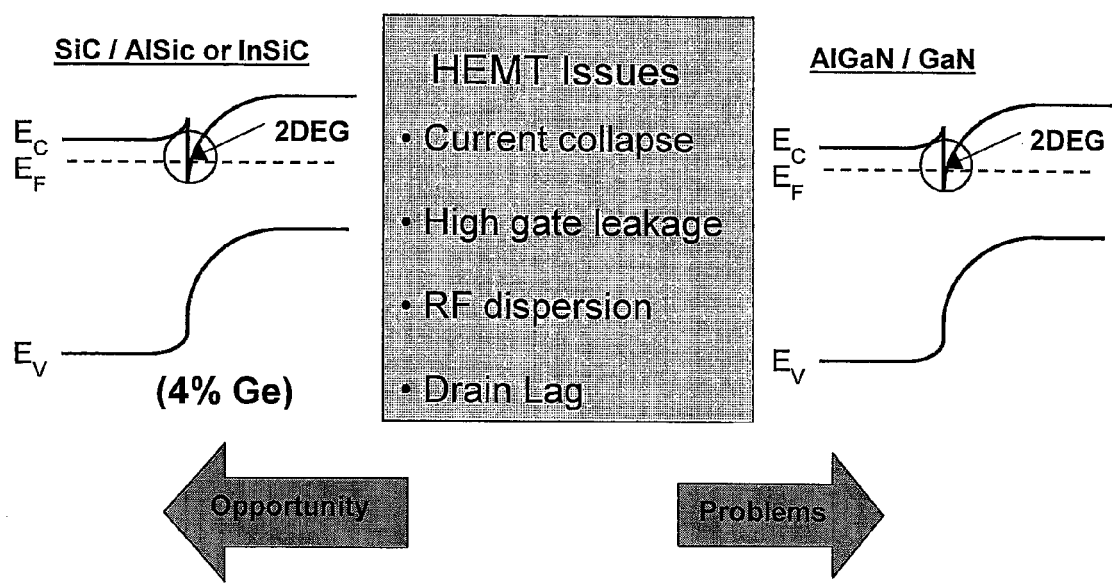
FIG. 1 shows the advantages of the invention that can be attained over the related art technology.

FIG. 1 shows the advantages of the invention when used to form two-dimensional electron gas (2DEG) heterostructures when compared to the related art technology, where Ev is the valence band energy, Ef is the Fermi band energy and Ec is the conduction and energy. When a wide band gap material is doped and placed adjacent to a narrow band gap material, the carrier starts to move from their parent dopants in the wide band gap material to the narrow band gap material due to the availability of states at lower energy. At the boundary, the band gap discontinuity causes the conduction band of the narrow band gap material to dip below the Fermi level. This band bending, which is a result due to charge transfer, and dipping of energy below the Fermi level causes the electron concentration to be very high at that point. This region of high electron concentration is so thin that it is described as a two-dimensional electron gas (2-DEG).

FIG. 1 shows that the related art technology such as AlGaN/GaN is prone to defect formation that can lead to gate lag (surface trapping), drain lag (buffer trapping), radio frequency (RF) dispersion, high gate leakage and even current collapse. In contrast, the inventive doping of Al, In or Ge into the SiC substrate can reduce defect structures to alleviate these problems. For example, the related art AlGaN/GaN technology can produce an electron mobility of 1300 $cm^2$Nsec at 300° K, but the Al, In or Ge doped hetero structure of the invention may attain an electron mobility in the range of about 1500-1800 $cm^2$Nsec at 300° K. Although the related art AlGaN/GaN technology can yield high radiation tolerance and high breakdown voltage, the Al, In or Ge doped heterostructure of the invention may attain very high radiation tolerance and breakdown voltage. Although the related art AlGaN/GaN technology can have an operating voltage equivalent to a GaN device, the Al, In or Ge doped heterostructure of the invention may attain an operating voltage of about twice that of a GaN device. Further, the HEMT issues mentioned above lead to uncertain reliability for the related art AlGaN/GaN technology, but the doping technology of the invention yields SiC devices having high reliability.

Figure 2:
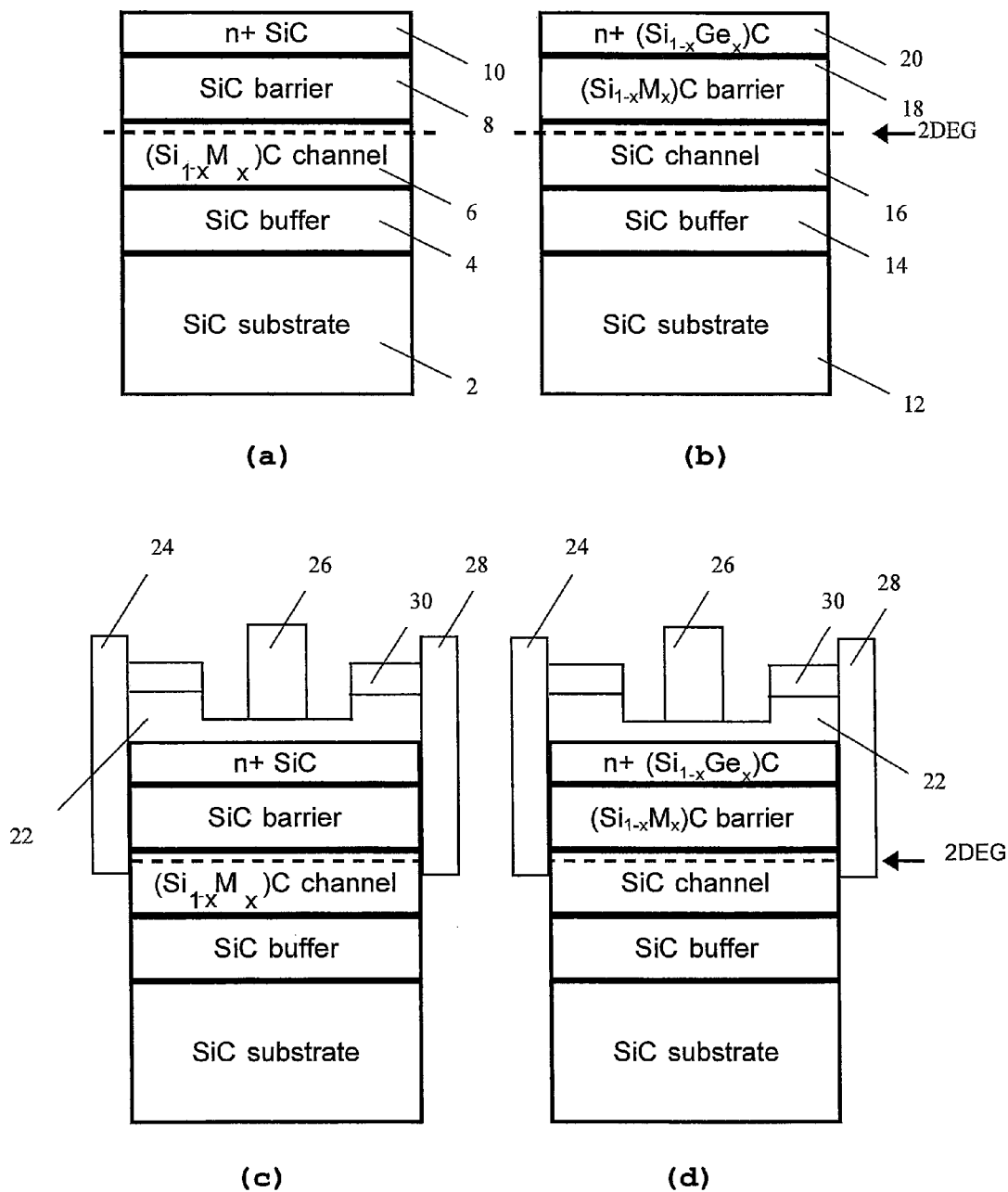
FIGS. 2a-2d show HEMT structures using $(Si_{1-x}M_x)C$ containing heterostructures.

FIGS. 2a-2d show the HEMT structures that can be attained using the $(Si_{1-x}M_x)C$ containing heterostructures of the invention. FIG. 2a shows an SiC substrate 2 over which is formed an SiC 4 buffer layer, an $(Si_{1-x}M_x)C$ channel 6, an SiC barrier layer 8 and an n+SiC layer 10. In the $(Si_{1-x}M_x)C$ channel 6, M can be Al, Ge or In. In FIG. 2a the 2DEG layer can be found at the interface of the $(Si_{1-x}Al_x)C$ channel 6 and the SiC barrier layer 8. FIG. 2b shows an SiC substrate 12 over which is formed an SiC buffer layer 14, an SiC channel layer 16, an $(Si_{1-x}M_x)C$ barrier layer 18, and an N+ $(Si_{1-x}Ge_x)C$ layer 20. In the $(Si_{1-x}M_x)C$ barrier layer 18, M can be Al, Ge or In. In FIG. 2b the 2DEG layer can be found at the interface of the SiC channel layer 16 and the $(Si_{1-x}M_x)C$ barrier layer 17.

After the heterostructures shown in FIGS. 2a and 2b are formed, a power device such as a transistor can be manufactured. FIGS. 2c and 2d show transistor structures respectively formed on the SiC heterostructures of FIGS. 2a and 2b. In FIGS. 2b and 2c, an optional active layer 22 may be formed. Then, a source 24, a gate 26 and a drain 28 may be formed. Also, a passivation layer 30 may be formed. The transistors of FIGS. 2c and 2d may be formed from SiC materials. Alternately, the transistor structures may be formed using Si, GaN or AlGaN technologies in the conventional manner. The transistors thus formed may be high frequency mobility transistors (HFMTs), heterojunction bipolar transistors (HBTs), or high electron mobility transistors (HEMTs).

The structures shown in FIGS. 2a-2d may be formed using epitaxial growth methods such as vapor deposition, molecular beam epitaxy or sputtering. Other methods for forming the structures may also be used, including chemical vapor deposition (CVD). Appropriate CVD methods may include atmospheric pressure CVD (APCVD), sub-atmospheric pressure CVD (SACVD), low pressure CVD (LPCVD), plasma enhanced CVD (PECVD), high-density plasma CVD (HD-PCVD), metal organic CVD (MOCVD) and vapor phase epitaxy (VPE). Semiconductor bonding techniques may also be used.

In the invention, the substrate may be a 6H SiC wafer with (001) orientation. The source SiC material may be powder. Aluminum (Al) can be used as the dopant, but other dopants may be used, including germanium (Ge) or indium (In). Aluminum may preferably be used as the dopant.

Approximately 0-10%, preferably 0.01-10%, more preferably 5-7% and most preferably 6% of dopant (such as Ge, In or preferably Al) may be placed in a crucible in a growth chamber. Argon may be preferably used in the growth chamber, however, any suitable inert gas or gas mixture may be used. A growth run of up to about 30 hours may produce an epitaxially grown film. The growth time depends on the desired thickness of the film, and a run time of about 15 hours may produce a film thickness of about 12 μm. The source temperature may be in the range of about 1800 to 2200° C. The chamber pressure may range from about 50 to 400 Torr.

Example 1

The substrate was an existing 6H SiC wafer with (001) orientation. The source SiC material was powder. Aluminum was used as the dopant. Approximately 6% aluminum was placed in the crucible. Argon was used in the growth chamber. A growth run of 15 hours produced epitaxially grown film. The growth conditions are shown in Table 1.

TABLE 1

| Growth Conditions For Al-doped SiC Film. | |
|---|---|
| Parameter | Values |
| Growth Method | PVT technique |
| Seed orientation | On-axis 6H-SiC (0001) |
| Source Temp. | 1800° C. |
| Seed Temp. | 1745° C. |
| Pressure in Chamber | 400 Torr Argon |
| Growth time | 15 hours |
| Source material | 94% (by weight) SiC powder 6% High purity Al pieces |
| Composition | $Si_{(1-x)}Al_xC$ film with approximately 6% Al, x = 0.06 |
| Film thickness | 12 μm |
| Cracks | No cracks observed |

Figure 3:
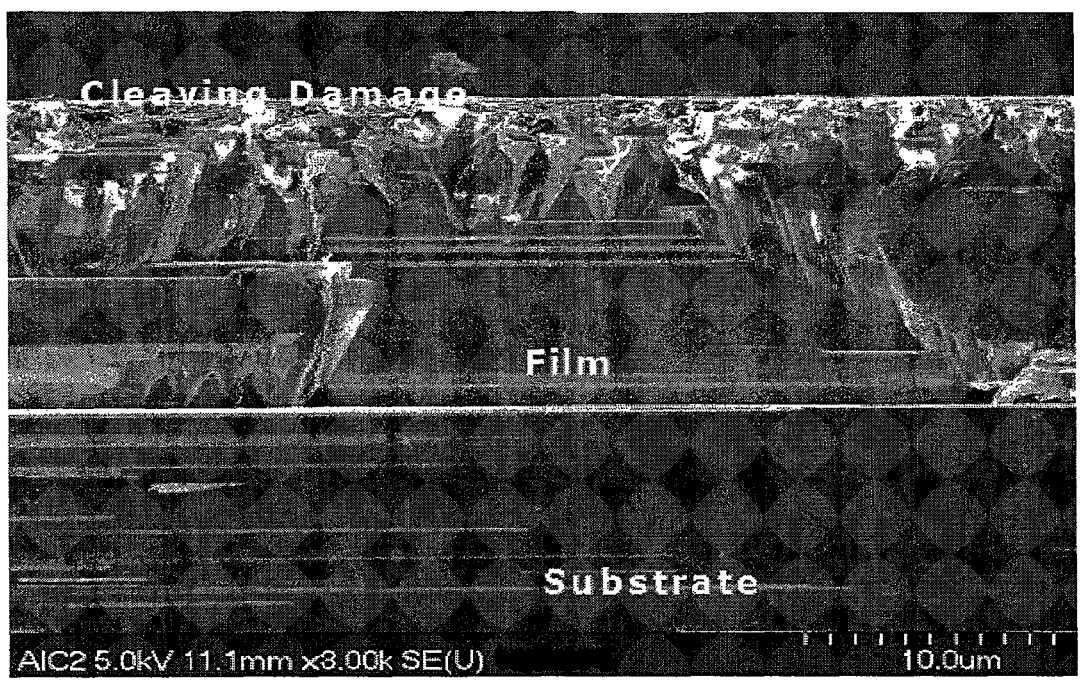
FIG. 3 is a scanning electron microscope (SEM) photomicrograph of cleaving damage in a heterostructure.

The film was characterized using a scanning electron microscope (SEM) for the morphology of the as-grown film. FIG. 3 shows the cross-sectional morphology of the as-grown film. In FIG. 3, the formation of the film over the substrate can readily observed. Some cleavage damage is an artifact of the preparation of the cross-sectional sample for SEM observation.

Figure 4:
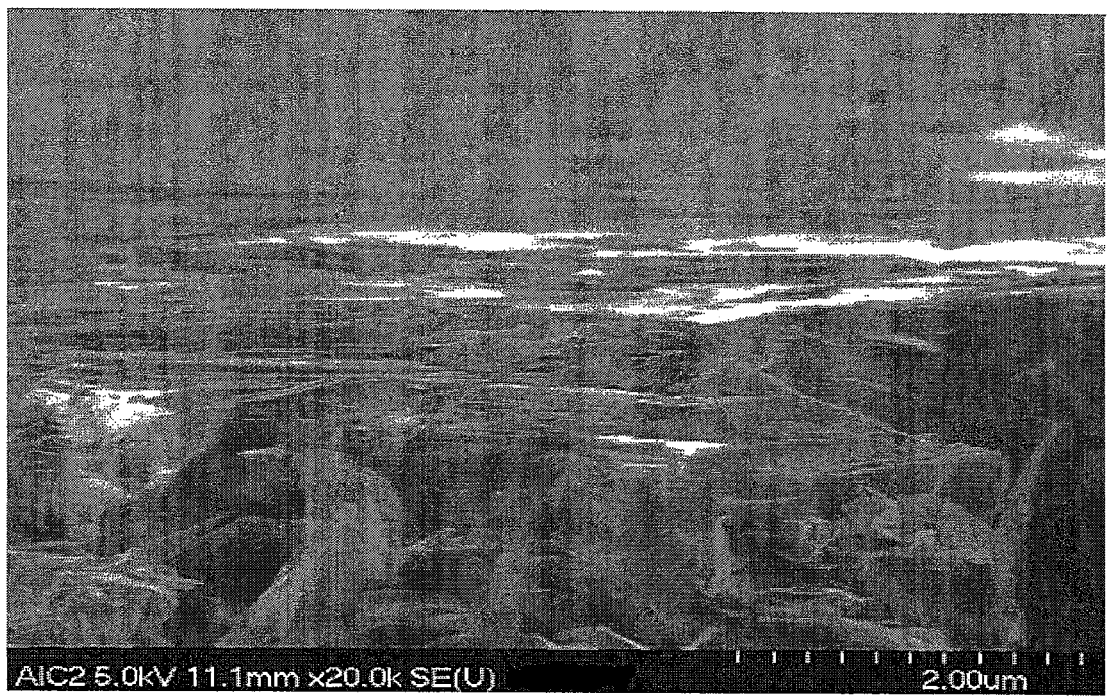
FIG. 4 is an SEM photomicrograph of a heterostructure cross section.

FIG. 4 shows another SEM view of the cross section of the as-grown film. In FIG. 4, the smoothness of the surface of the film can be readily observed.

Figure 5:
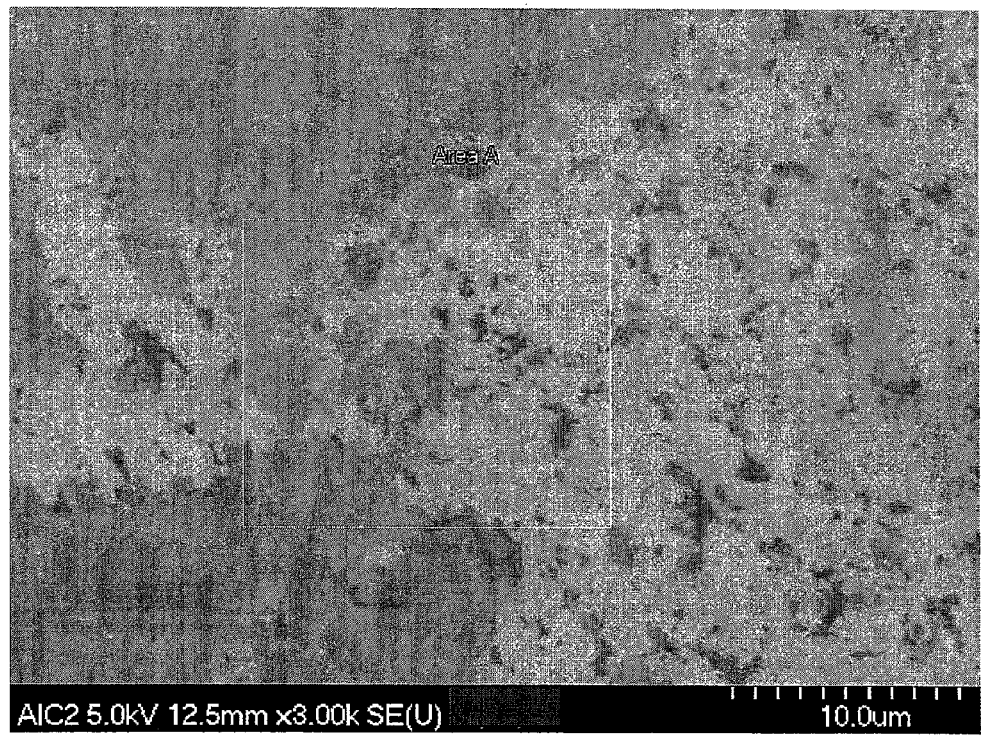
FIG. 5 shows the morphology of $Si_{(1-x)}Al_xC$ grown using PVD (Area A).
Figure 6:
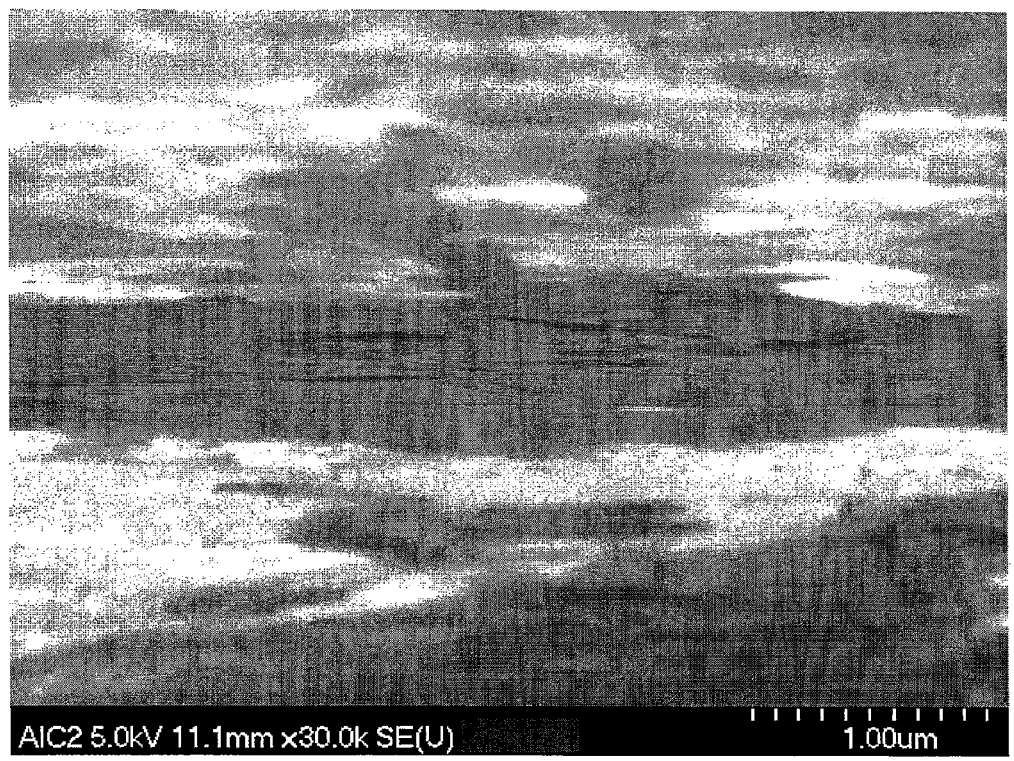
FIG. 6 shows another view of the morphology of $Si_{(1-x)}Al_xC$ grown using PVD.

FIG. 5 shows an SEM view of the surface of the Al film deposited on a SiC substrate in accordance with the invention. The large smooth areas indicate the low defect density of the formed Al film. The low defect density typically shown in FIG. 5 allows the formation of structures having minimal lattice defects over the film surface. FIG. 6 is another SEM view of the surface of the Al film deposited on a SiC substrate in accordance with the invention. FIG. 6 shows the even morphology of the surface structure and the lack of significant pitting or line defects. The smooth surface structures shown in FIGS. 5 and 6 allow an optimal junction formation to obtain a two dimensional electron gas (2-DEG)

Figure 7:
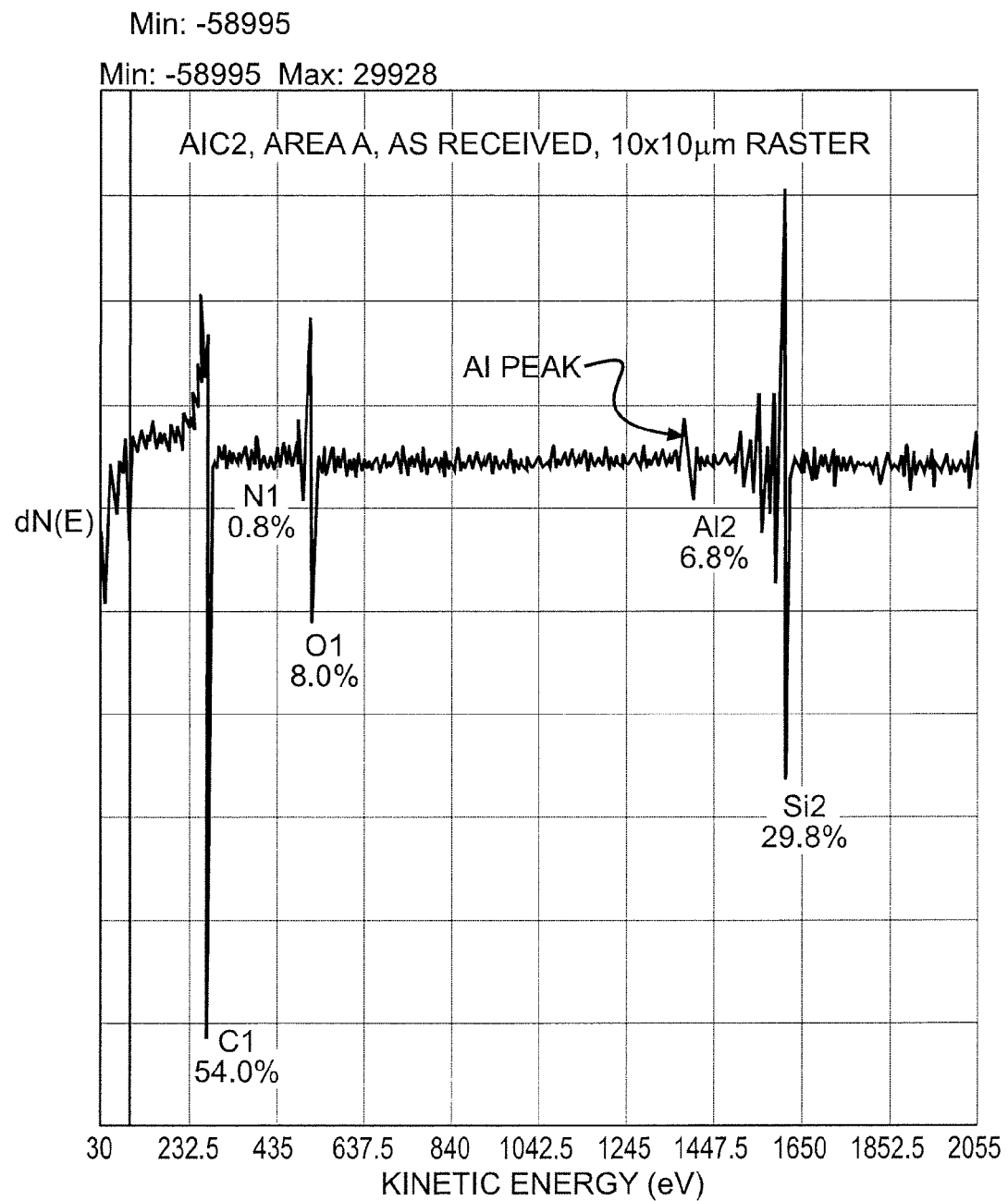
FIG. 7 shows the energy dispersive spectrometry (EDS) spectrum of $Si_{(1-x)}Al_xC$ grown using PVD.
Figure 8:
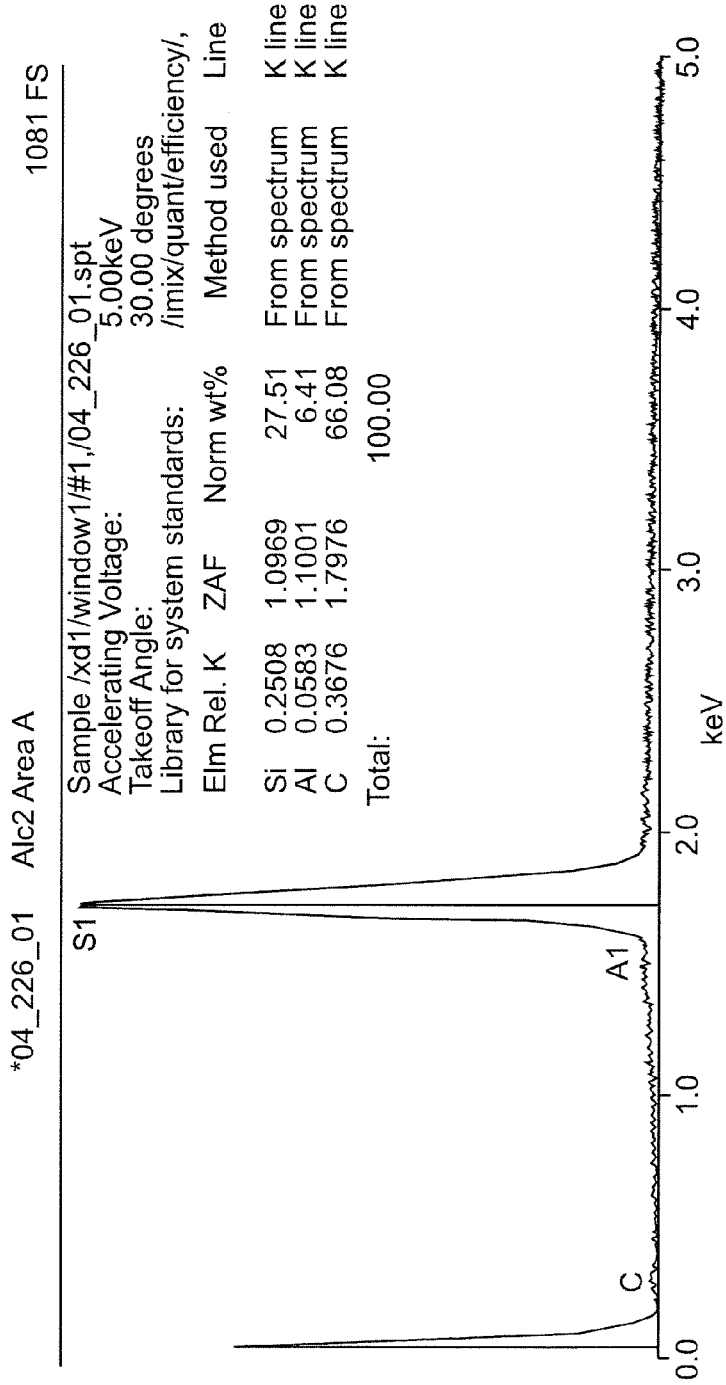
FIG. 8 shows the auger electron spectrometry (AES) spectrum of $Si_{(1-x)}Al_xC$ grown using PVD.

The results for energy dispersive spectrometry (EDS) are shown in FIG. 7. The peak for Al is readily observed in the neighborhood of 1400 eV. The integration of auger electron spectroscopy (AES) peaks is shown in FIG. 8. FIG. 8 verifies the composition to be about 6% Al, 27% Si and 66% C.

The film quality was also evaluated using an X-ray method. For the 6% Al doping concentration, the lattice parameter was observed to be very close to pure SiC.

Accordingly, the invention provides an $Si_{(1-x)}M_xC$ material for heterostructures on SiC that can be grown by CVD, PVD or MOCVD. SiC, preferably doped with Al, modifies the bandgap and hence the hetero structure. The growth of SiC—$Si_{(1-x)}M_xC$ heterojunctions using SiC and Al sources permits the fabrication of improved high frequency mobility transistors (HFMTs), heterojunction bipolar transistors (HBTs), and high electron mobility transistors (HEMTs).

It is to be understood that the foregoing descriptions and specific embodiments shown herein are merely illustrative of the best mode of the invention and the principles thereof, and that modifications and additions may be easily made by those skilled in the art without departing for the spirit and scope of the invention, which is therefore understood to be limited only by the scope of the appended claims.

What is claimed is:

1. A method for manufacturing a semiconductor device, comprising:
   providing an SiC substrate; and
   growing an epitaxial film of $Si_{(1-x)}M_xC$ to form a heterojunction over the substrate, wherein M is Al or In and x is greater than 0 and less than 1, and wherein the heterojunction comprises a $Si_{(1-x)}M_xC$ or SiC channel layer, a SiC or $Si_{(1-x)}M_xC$ barrier, respectively, on top of the channel layer, and a n+SiC layer or n+$Si_{(1-x)}Ge_xC$, respectively, on top of the barrier layer.

2. The method of claim 1, wherein M is Al and x is 0.06.

3. The method of claim 1, wherein in the step of growing the epitaxial film, a source temperature is about 1800 to 2200° C.

4. The method of claim 1, wherein the step of growing the epitaxial film, a seed temperature is about 1700-2100° C.

5. The method of claim 1, wherein in the step of growing the epitaxial film, a seed temperature is about 1745° C.

6. The method of claim 1, wherein in the step of growing the epitaxial film, the epitaxial film is grown under a pressure of about 50 to 400 Torr argon.

7. The method of claim 1, wherein in the step of growing the epitaxial film, the epitaxial film is grown for about 15 hours.

8. The method of claim 1, wherein the epitaxial film comprises doped SiC.

* * * * *